United States Patent
Ryu

(10) Patent No.: US 12,427,890 B2
(45) Date of Patent: Sep. 30, 2025

(54) SIMULATION SYSTEM AND DATA DISTRIBUTION METHOD

(71) Applicant: LG ENERGY SOLUTION, LTD., Seoul (KR)

(72) Inventor: Hojin Ryu, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 512 days.

(21) Appl. No.: 17/780,069

(22) PCT Filed: Dec. 10, 2020

(86) PCT No.: PCT/KR2020/018094
§ 371 (c)(1),
(2) Date: May 26, 2022

(87) PCT Pub. No.: WO2021/141255
PCT Pub. Date: Jul. 15, 2021

(65) Prior Publication Data
US 2023/0022353 A1  Jan. 26, 2023

(30) Foreign Application Priority Data
Jan. 7, 2020 (KR) .................. 10-2020-0002216

(51) Int. Cl.
*B60L 58/16* (2019.01)
*B60L 53/53* (2019.01)
*B60L 58/26* (2019.01)

(52) U.S. Cl.
CPC .............. *B60L 58/16* (2019.02); *B60L 53/53* (2019.02); *B60L 58/26* (2019.02)

(58) Field of Classification Search
None
See application file for complete search history.

(56) References Cited

U.S. PATENT DOCUMENTS

2011/0082621 A1*  4/2011  Berkobin .............. B60L 58/16
                                                     701/31.4
2014/0015494 A1*  1/2014  Kobayashi .......... B60L 53/16
                                                     320/137
(Continued)

FOREIGN PATENT DOCUMENTS

CN       104584376 A       4/2015
CN       105676133 A       6/2016
(Continued)

OTHER PUBLICATIONS

International Search Report (with partial translation) and Written Opinion issued in corresponding International Patent Application No. PCT/KR2020/018094, dated Apr. 9, 2021.
(Continued)

*Primary Examiner* — Rachid Bendidi
*Assistant Examiner* — Jason R Roberson
(74) *Attorney, Agent, or Firm* — Morgan, Lewis & Bockius LLP

(57) ABSTRACT

A simulation system of the present disclosure for performing an experiment on a battery pack including a plurality of battery cells by using at least one experimental device includes: an IoT device that receives input and output of at least one experimental device, and pre-processes the input and the output to generate input data and output data; an edge computing device for predicting information for predicting a capacity degradation value of a plurality of battery cells by using an equivalent circuit model module and a thermal model module based on data received among the input data and the output data; and a server that receives the predicted information from the edge computing device, predicts a capacity degradation value of a plurality of battery cells by using an aging model module, and predicts a defect rate based on the predicted capacity degradation values. The data size of the input data and output data transmitted from (Continued)

the IoT device to the edge computing device may be smaller than a predetermined data size.

19 Claims, 4 Drawing Sheets

(56) References Cited

U.S. PATENT DOCUMENTS

| | | | |
|---|---|---|---|
| 2014/0062415 A1* | 3/2014 | Barsukov | H02J 7/00041 |
| | | | 320/152 |
| 2016/0124052 A1 | 5/2016 | Inguva et al. | |
| 2016/0209472 A1 | 7/2016 | Chow et al. | |
| 2016/0243957 A1 | 8/2016 | Boehm et al. | |
| 2017/0205469 A1 | 7/2017 | Song et al. | |
| 2017/0307694 A1 | 10/2017 | Matsumura et al. | |
| 2018/0143257 A1 | 5/2018 | Garcia et al. | |
| 2019/0036351 A1* | 1/2019 | Tian | H02J 7/0071 |
| 2019/0212391 A1 | 7/2019 | Koller et al. | |
| 2019/0260827 A1 | 8/2019 | Tajima | |

FOREIGN PATENT DOCUMENTS

| | | |
|---|---|---|
| CN | 110062981 A | 7/2019 |
| CN | 110442941 A | 11/2019 |
| JP | 2008-076295 A | 4/2008 |
| JP | 2012-150086 A | 8/2012 |
| JP | 2015-059933 A | 3/2015 |
| JP | 2017-192252 A | 10/2017 |
| JP | 2019-060773 A | 4/2019 |
| KR | 10-2011-0111018 A | 10/2011 |
| KR | 10-2014-0075393 A | 6/2014 |
| KR | 10-2016-0090226 A | 7/2016 |
| KR | 10-1668288 B1 | 10/2016 |
| KR | 10-2017-0085365 A | 7/2017 |
| KR | 10-2032229 B1 | 10/2019 |
| KR | 10-2019-0134876 A | 12/2019 |
| WO | 2016/105735 A1 | 6/2016 |

OTHER PUBLICATIONS

Office Action dated May 9, 2023, issued in corresponding Japanese Patent Application No. 2022-527867.
Extended European Search Report dated Oct. 31, 2022, issued by the European Patent Office in corresponding European Patent Application No. 20911771.2.
Office Action dated Apr. 26, 2025, issued in corresponding CN Patent Application No. 202080081701.6. (Note—JP 2012-150086 A, JP 2017-192252 A, US 2011/0082621 A1, and US 2014/0015494 A1 cited in this CN Office Action have each already been cited in a prior IDS or PTO-892.).

* cited by examiner

SIMULATION SYSTEM AND DATA DISTRIBUTION METHOD

CROSS-REFERENCE TO RELATED APPLICATION

This application claims priority to and the benefit of Korean Patent Application No. 10-2020-0002216 filed in the Korean Intellectual Property Office on Jan. 7, 2020, the entire contents of which are incorporated herein by reference.

The present disclosure relates to a simulation system and a data distribution method.

BACKGROUND ART

For battery cycle-life analysis, a method that confirms the degree of degradation through actual charge and discharge experiments of battery cells or predicts the degree of degradation through a software simulation composed of MBD (Model Based Design) is used.

Particularly, the degeneration prediction through the software simulation method may be performed by calculating a scenario in advance and by configuring layers considering a current, an ECM (Equivalent Circuit Model), heat, and aging by fixing the virtual input value. Because the actual battery degradation requires long-term experimental or actually-measured data, the software simulation method is preferred, and the predicted battery degradation is used to determine the battery warranty period. However, currently, a hybrid, an electric vehicle, etc., are in a development stage, and there is not enough data on the input value, so power/temperature/a driving mode etc. are converted into input values to and used based on a driving data of gasoline vehicles.

DISCLOSURE

Technical Problem

The present disclosure is to provide a simulation system and a data distribution method that may improve accuracy and efficiency in a battery cycle-life prediction.

Technical Solution

A simulation system of the present invention for performing an experiment on a battery pack including a plurality of battery cells by using at least one experimental device includes an IoT device that receives input and output of at least one experimental device, and pre-processes the input and the output to generate an input data and output data; an edge computing device predicting information for predicting a capacity degradation value of a plurality of battery cells by using an equivalent circuit model module and a thermal model module based on a data received among the input data and the output data; and a server that receives the predicted information from the edge computing device, predicts a capacity degradation value of a plurality of battery cells by using an aging model module, and predicts a defect rate based on the predicted capacity degradation values.

The equivalent circuit model module may receive at least one among a battery pack voltage, an initial SOC, a current flowing to the battery pack, a temperature of the battery cell, a number of the battery cells configuring the battery pack, and a resistance battery pack from the IoT device, and predict at least one among the SOC of each of the battery cell, the pack voltage, the current flowing to the battery pack, a calorific value of the battery cell, and a current rate (C-Rate).

The thermal model module may receive the calorific value from the equivalent circuit model module, and receive the cooling performance input to predict the temperature of the battery cell.

The aging model module may receive at least one among the data about the SOC of each of the battery cells, the pack voltage, the current flowing into the battery pack, the current rate (C-Rate), and the temperature of the battery cell to predict the capacity retention and internal resistance of each of a plurality of battery cells.

The server may further include a capacity degradation value calculation unit that receives the capacity retention and internal resistance of each of the battery cells to predict a capacity degradation value indicating the degree of the capacity degradation of each battery cell; and a defect rate predicting unit that stores information about the capacity degradation value of each of the plurality of battery cells for each time unit, and predicts a defect rate by using the capacity degradation values.

The defect rate predicting unit, for each of n driving profiles, may multiply the corresponding weight value over time by the corresponding capacity degradation values to selects a plurality of capacity degradation weight values as a population, generate m probability distributions by using a bootstrap technique for the population, generate a cumulative distribution function for each of m probability distributions, and calculate a defect rate with the number of the capacity degradation weight value that deviates from a normal range in a normal distribution for each of m cumulative distribution functions.

The defect rate predicting unit may detect weight values corresponding to j probabilities in the order of highest probability from the cumulative distribution function corresponding to the normal distribution with the highest probability among the normal distributions for each of the m cumulative distribution functions.

The defect rate predicting unit may determine validity of the corresponding cumulative distribution function according to whether the probability distribution function corresponding to each of the m cumulative distribution functions can be specified.

The defect rate predicting unit may control the server to stop the prediction operation of the edge computing device when the defect rate exceeds a predetermined threshold value.

The edge computing device may stop the prediction operation by the control of the server, during the stop period, stores the input data and output data received from the IoT device, and when a restart instruction is received from the server, and resume the prediction operation reflecting the stored input data and the output data.

The defect rate predicting unit may notify that the defect rate exceeds the threshold value to the aging model module, and the aging model module may include a plurality of sets consisting of a plurality of formulas, and selects one of a plurality of sets to change the aging model.

A data distribution method of the present invention for performing an experiment on a battery pack including a plurality of battery cells using at least one experimental device includes starting a distribution processing operation for an experimental result by an edge computing device; receiving an input and output from the at least one experimental device by an IoT device, and booting up the IoT device into a ready state for distribution processing; generating input data and output data by the IoT device by receiving and pre-processing the input and output from at least one experimental device; receiving the initial value for the input data, and the input data and output data to predict the information necessary to predict the capacity degradation value by using an equivalent circuit model module and a thermal model module by the edge computing device; and receiving the predicted information from the edge computing device, and estimating the capacity retention and the internal resistance of each of a plurality of battery cells based on the predicted information by the server.

The data distribution method may further include predicting a capacity degradation value based on the capacity retention and internal resistance, and predicting a defect rate based on the predicted capacity degradation values by the server.

Advantageous Effects

The simulation system and the data distribution method that can improve accuracy and efficiency in the battery cycle-life prediction are provided.

MODES FOR INVENTION

Figure 1:
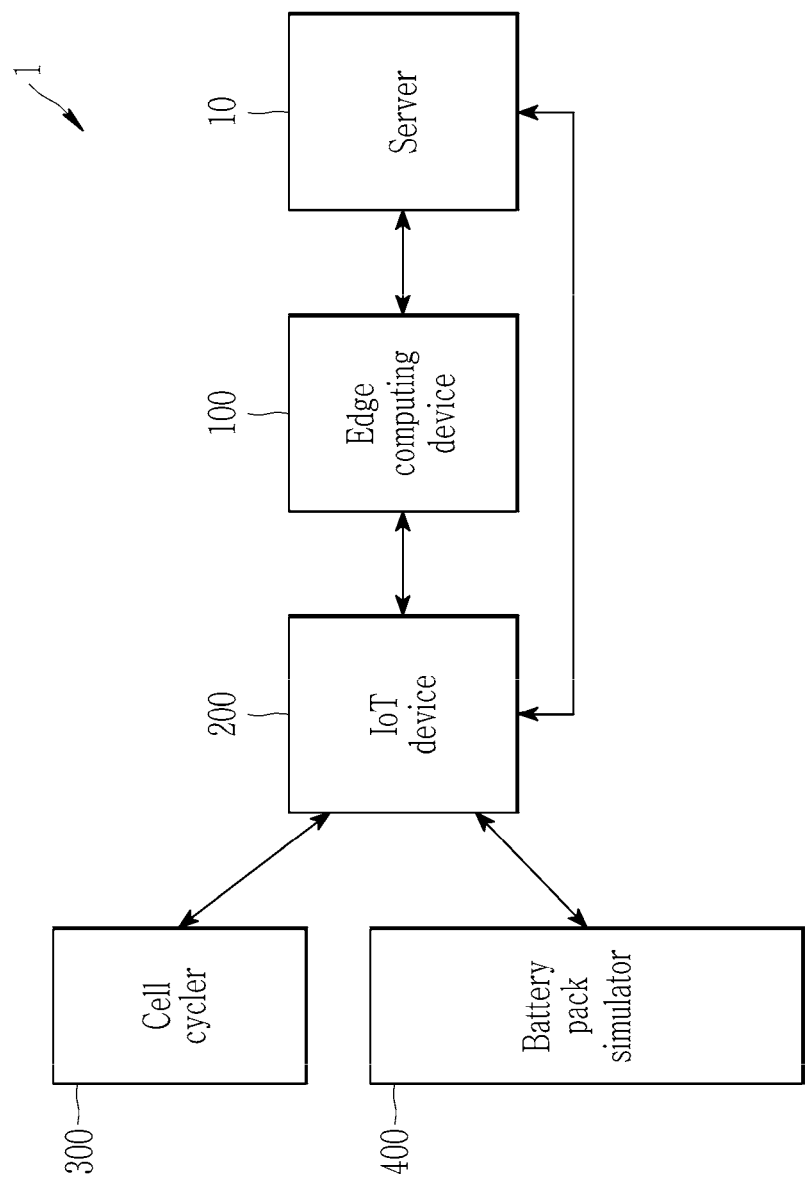
FIG. 1 is a view showing a simulation system according to an embodiment.

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to easily make a specification. Therefore, these terms do not have meanings or roles that distinguish them from each other in themselves. Further, in describing embodiments of the present specification, when it is determined that a detailed description of the well-known art associated with the present invention may obscure the gist of the present invention, it will be omitted. In addition, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" or "have" used in the present specification specify the presence of stated features, numerals, steps, operations, components, parts, or a combination thereof, but do not preclude the presence or addition of one or more other features, numerals, steps, operations, components, parts, or a combination thereof.

An embodiment executes a battery cycle-life degeneration simulation by distributing and processing edge computing functions by utilizing IoT (Internet of Things) devices.

For example, in the simulation to predict the cycle-life degeneration of a battery pack for an electric vehicle, by combining real-time input data/output data with IoT edge computing, it is possible to create a cycle-life degeneration prediction model with high accuracy at low cost.

The simulation system according to an embodiment includes an IoT device, an edge computing device, and a server as a distributed layer.

Hereinafter, an embodiment is described with reference to accompanying drawings.

FIG. 1 is a view showing a simulation system according to an embodiment.

As shown in FIG. 1, the simulation system 1 includes experimental devices 300 and 400, an IoT device 200, an edge computing device 100, and a server 10.

In FIG. 1, a cell cycler 300 and a battery pack simulator 400 are shown as two experimental devices 300 and 400, but the invention is not limited thereto.

The cell cycler 300 is connected to the battery pack, which is an experimental object, to charge and discharge the battery pack, and to measure battery information such as a battery cell voltage, a battery pack current, and a battery cell temperature during charging and discharging. The charge and discharge pattern may be determined according to a driving profile.

The battery pack simulator 400 may set a virtual battery pack that has the same electrical and chemical characteristics as the battery pack that is an experimental target, charge and discharge the virtual battery pack, and predict the battery information such as the battery cell voltage, the battery pack current, and the battery cell temperature during the charging and discharging. The charge and discharge pattern can be determined according to the operating profile.

The IoT device 200 receives an input and an output from the experimental device, pre-processes the data related to the received input and output, and transmits it to the edge computing device 100 or the server 10 according to the size of the pre-processed data. The IoT device 200 converts the received input and output into the data that may be processed by the edge computing device 100 and the server 10, which is called pre-processing. If the size of the pre-processed data is greater than or equal to a predetermined size, the IoT device 200 transmits the corresponding data to the server 10, and if the size is less than or equal to the predetermined size, the data is transmitted to the edge computing device 100. In this case, the predetermined size, which is a criterion for classifying the size of the data, may be determined in consideration of the size of the data that may be processed by the edge computing device 100, the processing speed, and the like.

The edge computing device 100 may analyze the data received from the IoT device 200 to generate the data necessary to predict the capacity deterioration value of the battery cell. For example, the IoT device 200 may transmit the battery pack voltage, an initial SOC, the current flowing through the battery pack, the battery cell temperature, the number of the battery cells constituting the battery pack, the battery pack resistance, and a cooling performance to the edge computing device 100.

Figure 2:
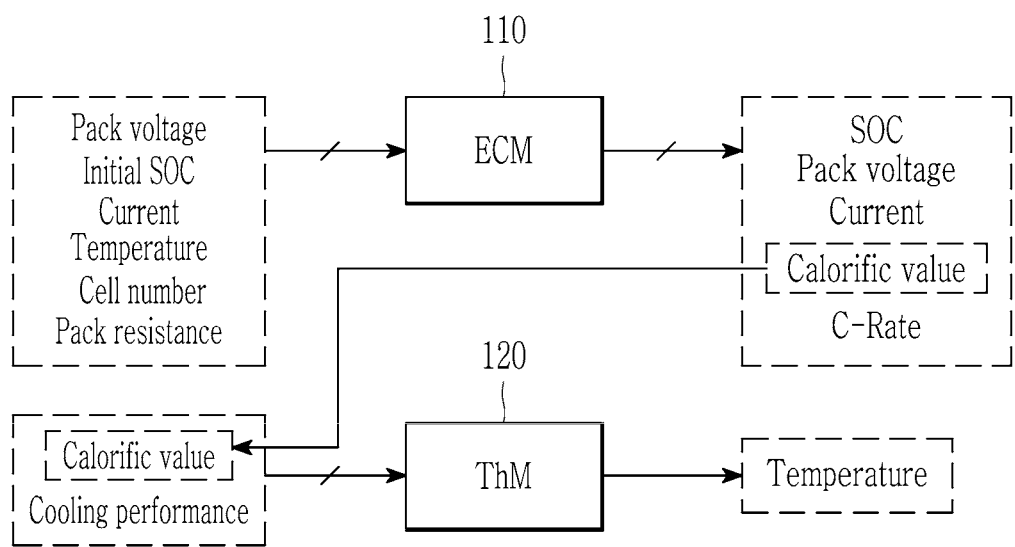
FIG. 2 is a view showing a configuration of an edge computing device according to an embodiment.

FIG. 2 is a view showing a configuration of an edge computing device according to an embodiment.

The edge computing device 100 includes an equivalent circuit model (ECM) module 110 and a thermal model (ThM) module 120.

The equivalent circuit model module 110 receives the battery pack voltage, the initial SOC, the current flowing to the battery pack, the temperature of the battery cell, the number of the battery cells configuring the battery pack, the resistance of the battery pack, etc. to predict the SOC of each battery cell, the pack voltage, the current flowing to the battery pack, a calorific value of the battery cell, a current rate (C-Rate), and the like. As a specific method for predicting the output data by applying the input data to the circuit model equivalent to the equivalent circuit model module 110 of the battery pack, various known methods may be applied.

For example, the equivalent circuit model (ECM) of the equivalent circuit model module 110 is an equivalent circuit constructed by simply simulating the complex interior caused by the chemical properties of the battery with electrical elements such as resistors and capacitors, and the equivalent circuit model module 110 may predict the output for any input using the ECM. Specifically, the equivalent circuit model module 110 may update the SOC of the battery by performing current integration with respect to the current input of the ECM, and calculate the OCV according to the updated SOC. In addition, the equivalent circuit model module 110 may calculate the voltage drop according to each parameter of the resistor and the capacitor according to the SOC and the temperature.

The current rate refers to the size of the charging current supplied to the battery pack or the discharge current supplied from the battery pack per unit time. For example, 1 C-Rate may mean the size of the current that the battery pack is fully charged in 1 hour, or the size of the current that the battery pack fully discharges in 1 hour.

The thermal model module 120 receives the calorific value and the cooling performance as the input and predicts the temperature of the battery cell. The calorific value is the data transmitted from the equivalent circuit model module 110, and the cooling performance may vary depending on the battery pack. As a specific method for predicting the temperature of each battery cell for the thermal model module 120 by receiving the calorific value and the cooling performance, various known methods may be applied.

For example, the calorific value of the cell input by the equivalent circuit model module 110 may be calculated as in Equation 1 below.

Calorific value of cell=(a correlation coefficient related to a battery cell voltage drop)*(a current flowing through a battery cell)*(an OCV according to SOC change-a battery cell voltage) [Equation 1]

The value derived from the calorific value of the cell by using the relational equation of the battery cell temperature, the cooling water temperature, and the thermal resistance value converges to (the battery cell mass)*(a specific thermal capacity)*(a change rate of the battery cell temperature (a differential value)) to calculate an average temperature value for the derived battery cell temperature, and the average temperature value may be used as the input value for the aging model 11. Among the input data required for the edge computing device 100, the number of the battery cells constituting the battery pack, the initial SOC, the cooling performance, etc. may be predetermined values according to experimental conditions.

The edge computing device 100 may transmit the predicted SOC of each battery cell, the pack voltage, the current flowing in the battery pack, the C-Rate, and the battery cell temperature to the server 10.

In FIG. 2, it is shown that the edge computing device 100 includes the equivalent circuit model module 110 and the thermal model module 120, however one of the equivalent circuit model module 110 and the thermal model module 120 may be provided in the server 10. In addition, the edge computing device 100 may further include a module necessary for predicting a capacity degradation value in addition to the equivalent circuit model module 110 and the thermal model module 120.

The server 10 may receive the output data of the edge computing device 100 to predict the capacity degradation value. The output data of the edge computing device 100 may include the data on the SOC of each battery cell, the pack voltage, the current flowing through the battery pack, the current rate (C-Rate), and the temperature of the battery cell. If necessary, the server 10 may receive more data required for predicting the capacity degradation value from the IoT device 200 as well as the edge computing device 100.

Figure 3:
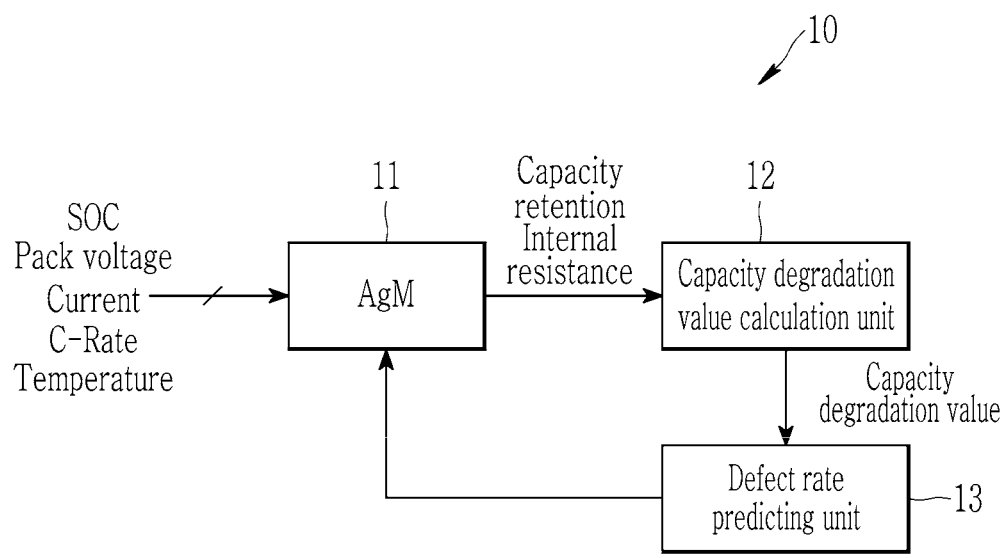
FIG. 3 is a view showing a partial configuration of a server according to an embodiment.

FIG. 3 is a view showing a partial configuration of a server according to an embodiment.

As shown in FIG. 3, a server 10 includes an aging model (AgM) 11, a capacity degradation value calculation unit 12, and a defect rate calculation unit 12.

The aging model 11 may predict capacity retention and internal resistance of each battery cell by using the SOC of each battery cell, the pack voltage, the current flowing through the battery pack, the current rate (C-Rate), and the battery cell temperature. As a specific method in which the aging model 11 predicts an increase in the capacity retention and the internal resistance of each battery cell by using the SOC of each battery cell, the pack voltage, the current flowing through the battery pack, the current rate (C-Rate), and the battery cell temperature, various known methods may be applied.

For example, based on a theory (e.g., Miner's rule) that explains a process leading to a fracture by accumulating invisible fatigue damage to a structural material when an irregular load is repeatedly applied to the structure material, the aging model 11 may define the driving condition as a cycle, the stop condition as a calendar, and calculate the capacity degradation value using the cycle and the calendar, and each duty value thereof, and calculate a resistance increase value by correlating a resistance increase curved line derived from the degeneration experiment of the battery cell using a capacity loss value derived in this process. The calculated capacity degradation value and resistance increase value are applied to the capacity retention and internal resistance to be predicted. The capacity retention is a result of measuring the ability of the battery cell to retain the stored energy during an extended open-circuit period, and the internal resistance is a result of measuring resistance components inside the battery cell. Although the aging model 11 has been described as predicting the internal resistance, the invention is not limited thereto, and an increase amount in the internal resistance and/or the internal resistance may be predicted.

The capacity degradation value calculation unit 12 may receive the capacity retention and the internal resistance of each battery cell, and predict the capacity degradation value indicating the degree of the capacity degradation of each battery cell. As a specific method for the capacity degradation value calculation unit 12 to predict the capacity degradation value using the increase amount of the capacity and the internal resistance of each battery cell, a method using a formula, a table, etc. for mapping the capacity degradation value corresponding to the capacity retention and the internal resistance based on the experimental may be applied. The defect rate predicting unit 13 may store information on the capacity degradation value of each of a plurality of battery cells for each time unit, and predict the defect rate by using the capacity degradation values. The unit of the defect rate may be parts per million (PPM).

The defect rate predicting unit 13 multiplies the corresponding capacity degradation values by a corresponding weight value depending on the lapse of time for each of the n driving profiles. The weight value corresponding to the lapse of time may be discretely set in a predetermined time unit, and the predetermined time may change with the lapse of time or may be a constant time. Hereinafter, the capacity degradation value multiplied by the weight value is referred to as a capacity degradation weight value.

The defect rate predicting unit 13 selects a population by collecting all a plurality of capacity degradation weight values for each of the n driving profiles, and generates m probability distributions for the population by using a bootstrap technique. The defect rate predicting unit 13 may select k values by m times by allowing an iteration for the population according to the bootstrap technique. The defect rate predicting unit 13 constructs a probability distribution for the k capacity degradation weight values, and this operation is performed m times.

The defect rate predicting unit 13 generates a cumulative distribution function for each of the m probability distributions. The defect rate predicting unit 13 may detect the weight values corresponding to j probabilities in the order of highest probability in the cumulative distribution functions corresponding to the normal distribution with the highest probability among the normal distributions for each of the m cumulative distribution functions. That is, the weight values of the capacity degradation weight values corresponding to each of the j probabilities may be detected.

Also, the defect rate predicting unit 13 may determine validity of the corresponding cumulative distribution function according to whether a probability distribution function corresponding to each of the m cumulative distribution functions may be specified. If there is a probability distribution function that matches the cumulative distribution function, it is determined that the corresponding cumulative distribution function is valid. In this case, types of the probability distribution functions may include 'beta', 'Birnbaum Saunders', 'exponential', 'extreme value', 'gamma', 'generalized extreme value', 'generalized pareto', 'inverse gaussian', 'logistic', 'log logistic', 'lognormal', 'Nakagami', 'normal', 'Rayleigh', 'Rician', 't location scale', 'Weibull', 'piecewise Pareto tail', etc.

The defect rate predicting unit 13 may calculate the defect rate with the number of the capacity degradation weight values that are out of the normal range in the normal distribution for each of the m cumulative distribution functions. For example, if the capacity degradation weight value is 30% or more, it may be determined that it is out of the normal range. When the defect rate exceeds a predetermined threshold value, the server 10 may be controlled so that the prediction operation of the edge computing device 100 is stopped. The server 10 may instruct the edge computing device 100 to stop the prediction operation, and the edge computing device 100 may stop the prediction operation. During this stop period, the edge computing device 100 may store the input data and the output data of the experimental devices 300 and 400 received from the IoT device 200. Later, when a restart instruction is received from the server 10 to the edge computing device 100, the edge computing device 100 may resume the prediction operation reflecting the stored input data and output data.

The defect rate predicting unit 13 informs the aging model 11 when the defect rate exceeds the threshold value, and the aging model 11 changes the aging model for predicting the capacity retention and internal resistance so that the defect rate does not exceed the threshold value. A plurality of sets composed of various formulas applied to the aging model are provided, and the aging model 11 changes the aging model by selecting one of a plurality of sets. The aging model 11 may consider the tendency of the capacity degradation value when selecting one of a plurality of sets. For example, the aging model 11 may select the corresponding set from a plurality of sets according to the change in the capacity degradation value over time.

Figure 4:
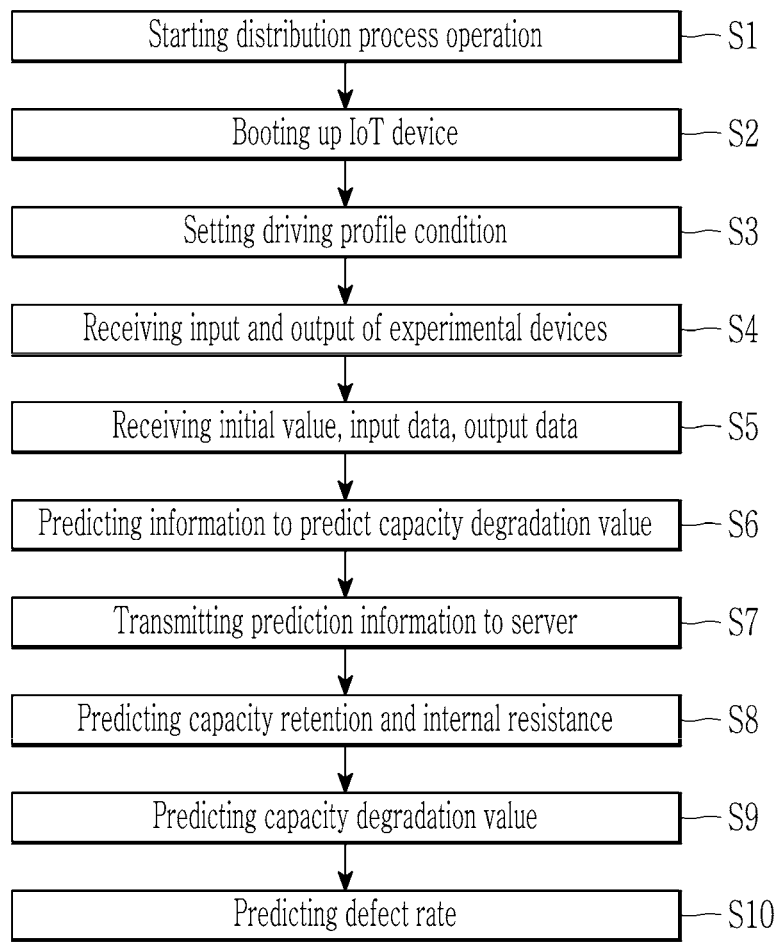
FIG. 4 is a flowchart showing a data distribution processing operation of a simulation system according to an embodiment.

FIG. 4 is a flowchart showing a data distribution processing operation of a simulation system according to an embodiment.

The edge computing device 100 starts the distribution processing operation for the experimental result (S1).

An experimenter's instruction for the distribution processing operation is input to the edge computing device 100, and then the edge computing device 100 may transmit the instruction for starting the distribution processing operation to the IoT device 200.

The IoT device 200 receives the input and the output from the experimental devices 300 and 400, and is booted up in a ready state for the distribution processing (S2).

The IoT device 200 may set conditions based on the driving profile (S3). The driving profile may include the conditions such as a power (Watt/Hour), a driving mode (Idle/Plug-In/Driving), and a temperature (° C.).

The IoT device 200 receives the input and the output from the experimental devices 300 and 400 (S4). As the input and the output received from the experimental devices 300 and 400, it may include a battery operation mode (Rest/Charging/Discharging), a pack voltage, a current flowing through the battery pack, a temperature, and the like. The IoT device 200 pre-processes the received input and output to generate input data and output data.

The edge computing device 100 receives an initial value for the input data and the preprocessed input data and output data from the IoT device 200 (S5). In this case, the input data and output data received by the edge computing device 100 may be data that is classified into a size suitable for the edge computing device 100 by the IoT device 200.

The edge computing device 100 may predict the information required to predict the capacity degradation value by using the equivalent circuit model module 110 and the thermal model module 120 based on the input data (S6). The necessary information may include the pack voltage, the SOC, the current flowing through the battery pack, the C-rate, the calorific value, and the like.

The information predicted by the edge computing device 100 is transmitted to the server 10 (S7).

The server 10 predicts the capacity retention and internal resistance based on the transmitted prediction information (S8).

The server 10 predicts the capacity degradation value based on capacity retention and internal resistance (S9).

The server 10 predicts the defect rate based on the predicted capacity degradation values (S10).

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A simulation system for performing an experiment on a battery pack including a plurality of battery cells, the simulation system comprising:
   at least one of:
      a cell cycler connected to the battery pack to charge and discharge the battery pack and to measure battery information during charging and discharging; and
      a battery pack simulator configured to set a virtual battery pack having same electrical or chemical characteristics as the battery pack, to charge and discharge the virtual battery pack, and to predict the battery information during charging and discharging;
   an internet of things (IoT) device configured to:
      receive an input provided to and an output generated by the at least one of the cell cycler and the battery pack simulator, and
      pre-process the input and the output to generate pre-processed data;
   an edge computing device configured to predict battery data for the battery cells by using an equivalent circuit model and a thermal model based on the pre-processed data received from the IoT device; and
   a server configured to:
      receive the predicted battery data from the edge computing device,
      predict a capacity degradation value of each of the plurality of battery cells based on the predicted battery data by using an aging model,
      predict a defect rate of the battery pack based on the predicted capacity degradation value, and
      control the edge computing device to stop predicting the battery data if the defect rate exceeds a predetermined threshold value,
   wherein the IoT device is further configured to transmit the pre-processed data to the edge computing device if a size of the pre-processed data is smaller than a predetermined size, and to the server if the size of the pre-processed data is greater than or equal to the predetermined size.

2. The simulation system of claim 1, wherein the edge computing device is further configured to:
   receive the pre-processed data, including at least one among a battery pack voltage, an initial state of charge (SOC), a current flowing through the battery pack, a temperature of the battery cells, a number of battery cells configuring the battery pack, and a resistance of the battery pack, from the IoT device, and
   predict the battery data, including at least one among an SOC of each of the battery cells, the battery pack voltage, the current flowing to the battery pack, a calorific value of each of the battery cells, and a current rate (C-Rate), by inputting the received pre-processed data into the equivalent circuit model.

3. The simulation system of claim 2, wherein:
   the received pre-processed data further includes a cooling performance of the battery pack; and
   the edge computing device is further configured to predict the temperature of the battery cells by inputting the calorific value predicted by the equivalent circuit model and the cooling performance into the thermal model.

4. The simulation system of claim 3, wherein the server is further configured to:
   receive the predicted battery data from the edge computing device, including at least one among the SOC of each of the battery cells, the battery pack voltage, the current flowing through the battery pack, the current rate (C-Rate), and the temperature of the battery cells; and
   predict a capacity retention value and an internal resistance of each of the battery cells by inputting the received predicted battery data into the aging model.

5. The simulation system of claim 4, wherein the server includes:
   a capacity degradation value calculator configured to receive the capacity retention value and the internal resistance of each of the battery cells to predict the capacity degradation value indicating a degree of capacity degradation of each of the battery cells; and
   a defect rate predictor configured to store information about the capacity degradation value of each of the plurality of battery cells for each time unit and to predict the defect rate by using the capacity degradation values.

6. The simulation system of claim 5, wherein:
   the defect rate predictor is further configured, for each of n driving profiles, to multiply a corresponding weight value over time by a corresponding one of the capacity degradation values to select a plurality of capacity degradation weight values as a population, to generate m probability distributions by using a bootstrap technique for the population, to generate a cumulative distribution function for each of the m probability distributions, and to calculate the defect rate with the number of the capacity degradation weight values that deviate from a normal range in a normal distribution for each of m cumulative distribution functions.

7. The simulation system of claim 6, wherein:
   the defect rate predictor is further configured to detect weight values corresponding to j probabilities in an order of a descending probability from a cumulative distribution function corresponding to a normal distribution with a highest probability among normal distributions respectively corresponding to the m cumulative distribution functions.

8. The simulation system of claim 6, wherein:
   the defect rate predictor is further configured to determine validity of the corresponding cumulative distribution function according to whether a probability distribution function corresponding to each of the m cumulative distribution functions can be specified.

9. The simulation system of claim 6, wherein:
   the defect rate predictor is further configured to control the server to stop the prediction operation of the edge computing device if the defect rate exceeds the predetermined threshold value.

10. The simulation system of claim 9, wherein:
    the edge computing device is further configured to stop the prediction operation by the control of the server, to store the pre-processed data received from the IoT device during a period in which the prediction operation is stopped, and to resume the prediction operation reflecting the stored pre-processed data if a restart instruction is received from the server.

11. The simulation system of claim 9, wherein:
the defect rate predictor is configured to notify the aging model that the defect rate exceeds the predetermined threshold value, and
the aging model includes a plurality of sets each including a plurality of formulas, the aging model being configured to select one of the plurality of sets to change the aging model.

12. A data distribution method for performing an experiment on a battery pack including a plurality of battery cells using at least one of a cell cycler and a battery pack simulator, the data distribution method comprising:
receiving, by an internet of things (IoT) device, an input provided to and an output generated by the experimental device at least one of the cell cycler and the battery pack simulator, and booting up the IoT device into a ready state for the distribution processing operation;
pre-processing the input and the output by the IoT device to generate pre-processed data;
predicting, by an edge computing device, battery data for the battery cells based on the pre-processed data by using an equivalent circuit model and a thermal model;
predicting a capacity degradation value of each of the plurality of battery cells based on the predicted battery data by using an aging model;
predicting a defect rate of the battery pack based on the predicted capacity degradation value;
controlling, by a server, the edge computing device to stop predicting the battery data if the defect rate exceeds a predetermined threshold value; and
transmitting, by the IoT device, the pre-processed data to the edge computing device if a size of the pre-processed data is smaller than a predetermined size, and to the server if the size of the pre-processed data is greater than or equal to the predetermined size,
wherein:
the cell cycler is connected to the battery pack to charge and discharge the battery pack and to measure battery information during charging and discharging; and
the battery pack simulator is configured to set a virtual battery pack having same electrical or chemical characteristics as the battery pack, to charge and discharge the virtual battery pack, and to predict the battery information during charging and discharging.

13. The data distribution method of claim 12, wherein the predicting of the capacity degradation value includes:
estimating, by the server, a capacity retention value and an internal resistance of each of the battery cells based on the predicted battery data by using the aging model; and
predicting the capacity degradation value for each of the battery cells based on the capacity retention value and the internal resistance.

14. The data distribution method of claim 12, wherein the predicting of the battery data by the edge computing device includes:
receiving the pre-processed data, including at least one among a battery pack voltage, an initial state of charge (SOC), a current flowing through the battery pack, a temperature of the battery cells, a number of battery cells configuring the battery pack, and a resistance of the battery pack, from the IoT device; and
predicting at least one among an SOC of each of the battery cells, the battery pack voltage, the current flowing to the battery pack, a calorific value of each of the battery cells, and a current rate (C-Rate), by inputting the received pre-processed data into the equivalent circuit model.

15. The data distribution method of claim 14, wherein:
the received pre-processed data further includes a cooling performance of the battery pack; and
the predicting of the battery data by the edge computing device further includes predicting the temperature of the battery cells by inputting the calorific value predicted by the equivalent circuit model and the cooling performance into the thermal model.

16. The data distribution method of claim 12, wherein the battery information is at least one of a battery cell voltage, a battery pack current, and a battery cell temperature.

17. The data distribution method of claim 12, wherein:
the input and the output include a battery operation mode, a battery pack voltage, a current flowing through the battery pack, and a temperature of the battery pack; and
the battery operation mode is one of rest, charging, and discharging.

18. The simulation system of claim 1, wherein the battery information is at least one of a battery cell voltage, a battery pack current, and a battery cell temperature.

19. The simulation system of claim 1, wherein:
the input and the output include a battery operation mode, a battery pack voltage, a current flowing through the battery pack, and a temperature of the battery pack; and
the battery operation mode is one of rest, charging, and discharging.

* * * * *